United States Patent
Huang et al.

(10) Patent No.: US 8,004,342 B2
(45) Date of Patent: Aug. 23, 2011

(54) MIXER WITH SHORTING SWITCH

(75) Inventors: Qiuting Huang, Zollikon (CH);
Dimitrios Filippos Papadopoulos, Zurich (CH)

(73) Assignee: ACP Advanced Circuit Pursuit AG, Zollikon (CH)

( * ) Notice: Subject to any disclaimer, the term of this patent is extended or adjusted under 35 U.S.C. 154(b) by 0 days.

(21) Appl. No.: 12/449,466

(22) PCT Filed: Feb. 8, 2008

(86) PCT No.: PCT/EP2008/000974
§ 371 (c)(1),
(2), (4) Date: Dec. 28, 2009

(87) PCT Pub. No.: WO2008/095719
PCT Pub. Date: Aug. 14, 2008

(65) Prior Publication Data
US 2010/0117712 A1    May 13, 2010

(30) Foreign Application Priority Data
Feb. 9, 2007   (GB) .................................. 0702588.5

(51) Int. Cl.
*G06G 7/12*   (2006.01)

(52) U.S. Cl. .......................... 327/355; 327/359; 455/326
(58) Field of Classification Search .......... 327/355–361; 455/323, 326
See application file for complete search history.

(56) References Cited

U.S. PATENT DOCUMENTS

| 7,383,034 B2* | 6/2008 | Shima et al. .................. 455/326 |
| 7,437,131 B2* | 10/2008 | Wu et al. ..................... 455/127.1 |
| 2003/0169089 A1 | 9/2003 | Manku et al. |
| 2004/0227559 A1 | 11/2004 | Erba et al. |
| 2006/0128340 A1 | 6/2006 | Hsieh et al. |

OTHER PUBLICATIONS

PCT International Search Report and Written Opinion dated Sep. 22, 2008 in related PCT Application No. PCT/EP2008/000974.

* cited by examiner

*Primary Examiner* — Dinh T. Le
(74) *Attorney, Agent, or Firm* — Stout, Uxa, Buyan & Mullins

(57) ABSTRACT

A double-balanced mixer is provided having a shorting switch connecting the signal inputs to the mixer core. A timer circuit provides pulses to close the switch, thereby shorting those inputs at times when the switches of the mixer core are switching. This is done because non-linear components in the output are produced at those times and therefore they can be removed if the signal input is shorted at those times.

15 Claims, 11 Drawing Sheets

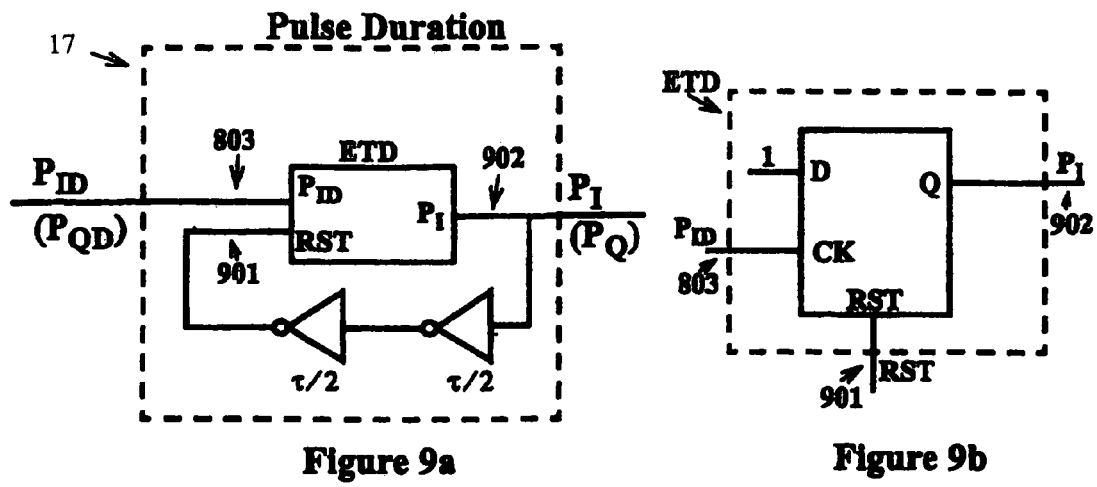
Figure 9a
Figure 9b
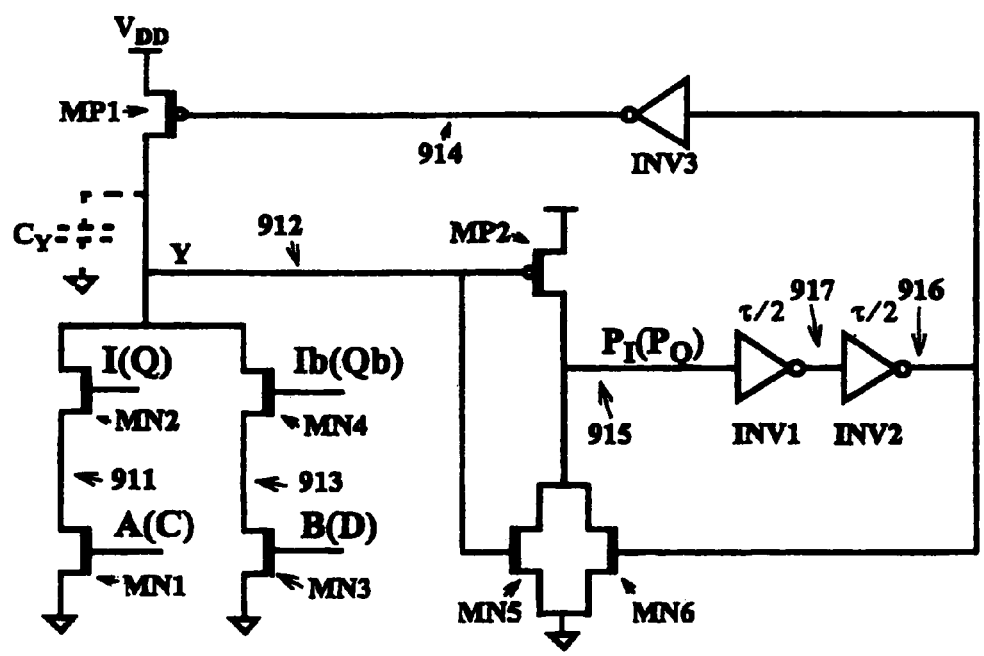
Figure 9c

US 8,004,342 B2

MIXER WITH SHORTING SWITCH

The present invention relates to double-balanced mixers used in modulators and demodulators, especially linear modulators for wireless communications.

BACKGROUND OF THE INVENTION

Modulators for wireless transmission schemes such as EDGE or WCDMA, in which part or all of the information is carried in the signal amplitude, need to be linear. Non-linearity causes transmission in frequencies outside the intended channel, causing interference in neighbouring channels. These problems are acute in modulators providing relatively high power outputs, where large signal currents cannot be switched instantaneously.

A typical double-balanced mixer 1, commonly used in a linear modulator, is shown in FIG. 1. A pair of nodes 2 and 3 is provided as an input for a differential modulating signal. The latter is marked as voltage $V_i$ and $-V_i$ being applied to 2 and 3, respectively. Another pair of nodes 7 and 8 is provided as an input for a local oscillator signal. In the remainder of the text we will refer to the local oscillator signal actually applied to nodes 7 and 8 as the clock signal. This facilitates the description of the various versions of the local oscillator signal typically found in a modulator, such as the signals generated by the local oscillator or synthesizer (the LO signal), its phase shifted and possibly frequency-divided versions, and the final in-phase (I) and quadrature (Q) switching signals at the radio carrier frequency that actually open and close the commutating switches in a double balanced mixer. The output of the double-balanced mixer is also in differential form and is provided by nodes 10 and 11. A first pair of transistors M1 and M2, having their source terminals connected to node 4, gate terminals respectively connected to 2 and 3, and drain terminals respectively connected to nodes 5 and 6, form a transconductor to convert the differential signal $V_i$ into a differential current signal i. In FIG. 1 the said differential current signal is marked together with the bias current $I_B$ (connected between node 4 and ground) as $I_B/2+i$ for node 5 and $I_B/2-i$ for node 6. A second pair of NMOS transistors M3 and M4 have their sources connected to node 5 and their drains respectively connected to outputs 10 and 11. A third pair of NMOS transistors M5 and M6 have their sources connected to node 6 and their drains respectively connected to outputs 10 and 11. A pair of clock signals $LO^+$ and $LO^-$ in antiphase is provided by a local oscillator 9 (or clock generator 9 if it receives the local oscillator signal and generates the clocking signals with appropriate phasing and delays). These are applied respectively to input nodes 7 and 8 of the double balanced mixer and used to open and close its switches, which are typically provided as MOSFET or BJT transistors and shown here as M3, M4, M5 and M6. Clock signal $LO^+$ at node 7 is connected to the gates of transistors M3 and M6, while clock signal $LO^+$ at node 8 is connected to the gates of transistors M4 and M5. Since the clocks are in anti-phase transistors M3 and M6 are generally on while transistors M4 and M5 are off, in which state node 5 is connected to output node 10 via M3 and node 6 is connected to output node 11 via M6, and vice versa, in which state node 5 is connected to node 11 via M4 and node 6 is connected to node 10 via M5.

Ideally the transitions between the said two states should be instantaneous, so that mathematically the four commutating switches M3, M4, M5 and M6, referred to as the mixer core, serve to realize a multiplication of the input current i by an alternating sequence of 1s and −1s at the frequency of the clock signal. In practical implementations, however, the transition time $\tau$ between the two states is non-zero and depends both on the dimensions of the switches and the magnitude of the current being switched. During the transition all four transistors M3, M4, M5 and M6 are on and harmonics of the signal current i are created in the output. With dimensions of the switching transistors limited by speed and noise considerations in a particular application, increasing magnitude of the signal current will result in increasing transition time $\tau$, and consequently nonlinearity of the mixer core.

SUMMARY OF THE INVENTION

According to the present invention there is provided a mixer and a method of mixing as defined in the appended claims.

The invention substantially reduces the nonlinearity caused by switching transitions in double balanced mixers. By blanking out the output of the mixer core by shorting the inputs during the transition times no harmonics of the signal current will be created in the output. Any reduction of signal gain due to blanking is outweighed by improved mixer linearity and larger input signal that the mixer core is capable of processing.

BRIEF DESCRIPTION OF THE DRAWINGS

Examples of the invention will now be described, with reference to the accompanying drawings, of which:

FIG. 5b shows signal waveforms illustrating the generation of shorting pulses by the circuit of FIG. 5a.

FIG. 6b is the logic diagram of a possible master-slave implementation of the phase shifting circuit 6 in FIG. 6a.

FIG. 6c is the logic diagram of another possible master-slave implementation of the phase shifting circuit 6 in FIG. 6a.

FIG. 6d is the logic diagram of a third possible master-slave implementation of the phase shifting circuit 6 in FIG. 6a.

FIG. 8b is the logic diagram of a possible realization of the edge detector circuit of FIG. 8a.

FIG. 8c is the logic diagram of another possible realization of the edge detector circuit of FIG. 8a.

FIG. 9a is a logic and block diagram of a possible realization of pulse duration circuit in FIG. 6a, combined with the edge detector circuit of FIG. 8b.

FIG. 9b is a logic diagram of a possible realization of the edge-triggered delay circuit in FIG. 9a.

FIG. 9c is a circuit schematic of a possible simplified realization of the combined circuit in FIG. 9a and FIG. 8b.

DETAILED DESCRIPTION

Figure 1:
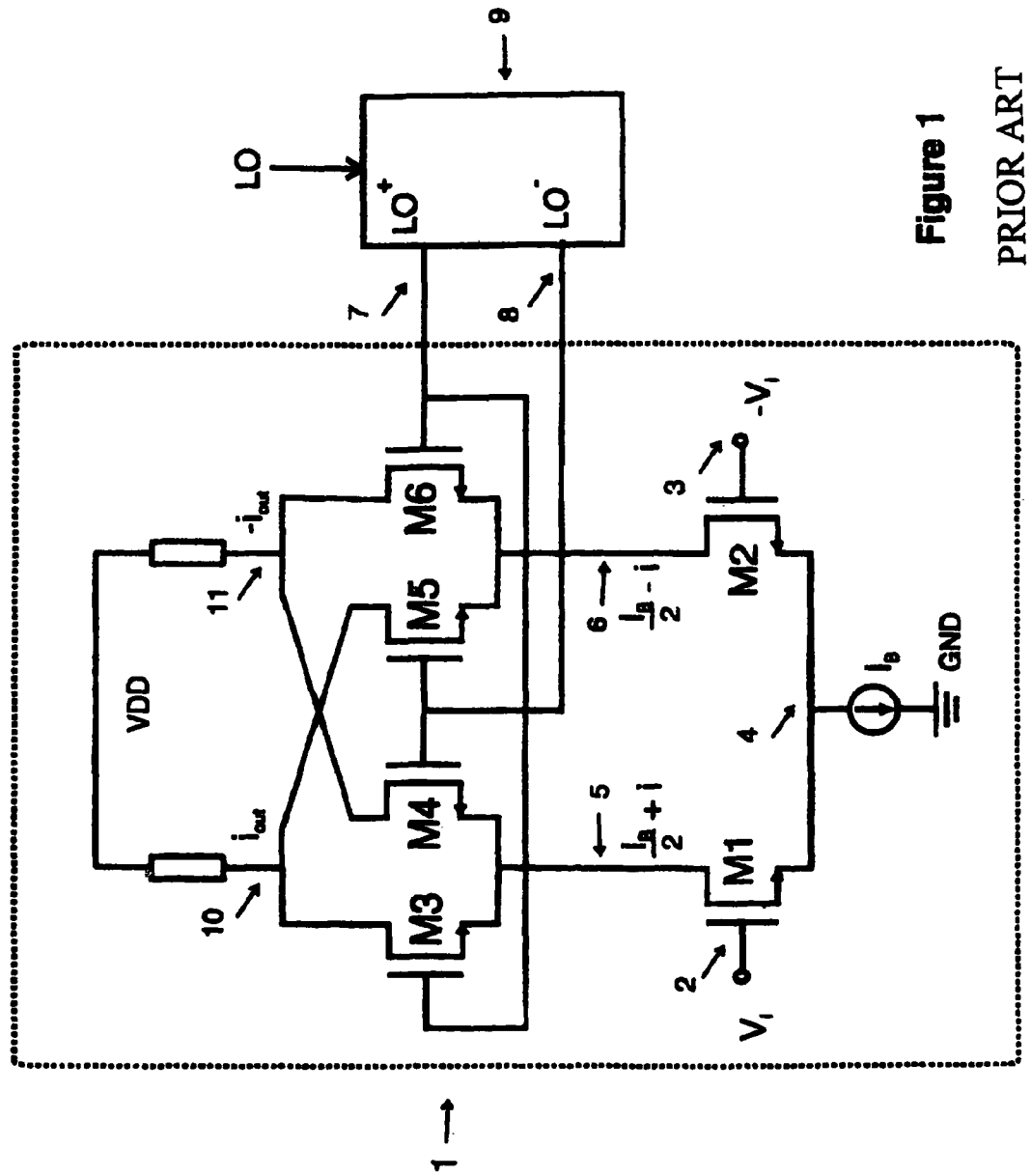
FIG. 1 is a circuit diagram of a known double balanced mixer.
Figure 2:
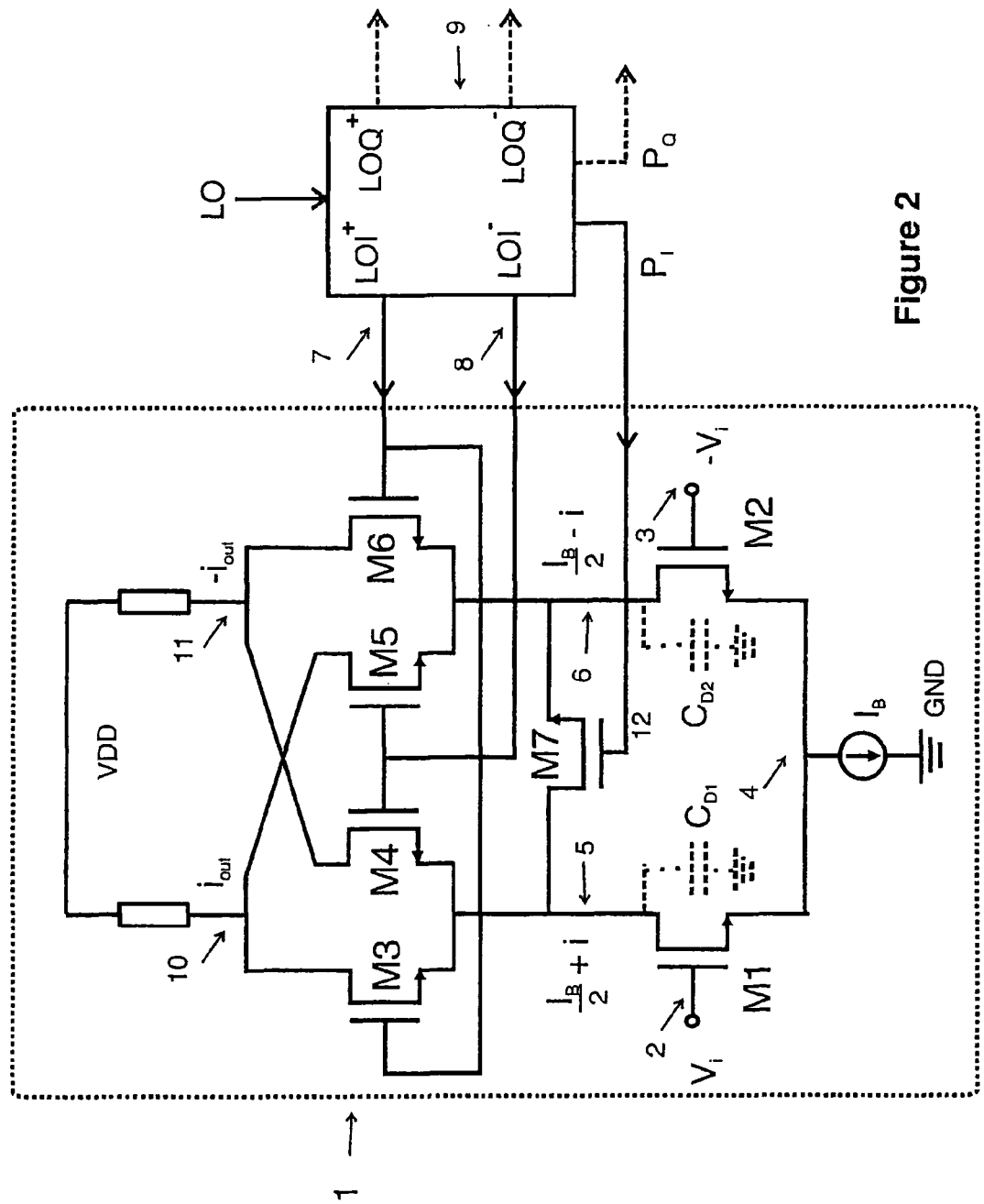
FIG. 2 is a circuit diagram of a double balanced mixer in accordance with the invention.
Figure 3:
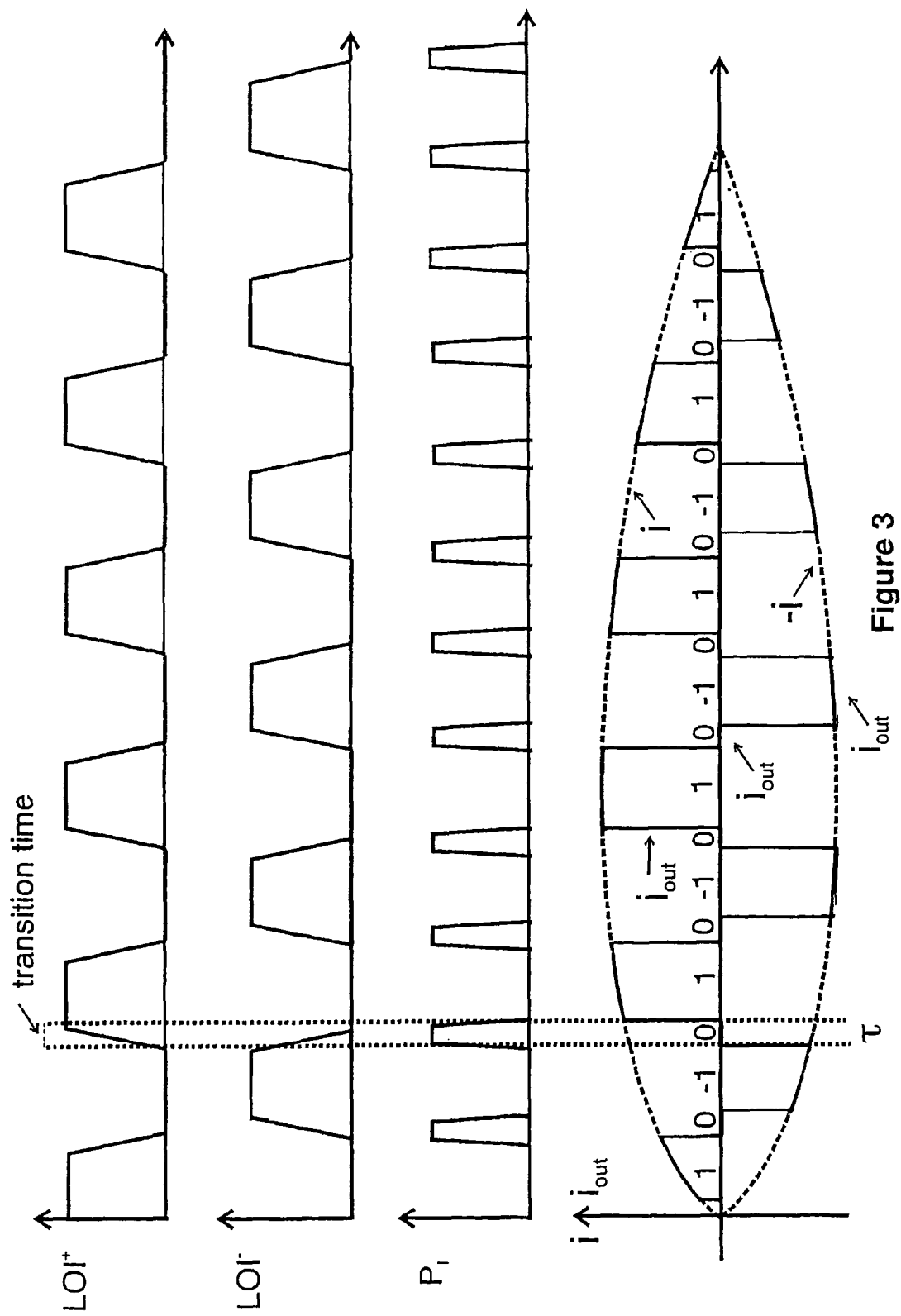
FIG. 3 shows clock signal and shorting pulse waveforms to illustrate the operation of the new mixer.

FIG. 2 is a circuit diagram of a first example of a circuit according to the invention. The circuit is a double balanced mixer similar to that of FIG. 1. It has the same inputs 2 and 3 for the differential input signal, inputs 7 and 8 for anti-phase clocks, differential outputs 10 and 11, a pair of transistors M1 and M2 forming a transconductor and four switching transistors M3, M4, M5 and M6 forming the mixer core, all having the same connections to those inputs and outputs. According to the present invention, the circuit has in addition a further switch transistor M7 connected between nodes 5 and 6, which nodes serve both as the differential output of the transconductor and the differential input of the mixer core. Switch M7 is controlled to open and close by a control and clock generation circuit 9. The control and clock generation circuit is connected to receive the local oscillator signals LO and in response to provide both clock signals LOI+ LOI− (being a delayed version of the local oscillator signals LO) for the mixer core and pulses that cause switch M7 to close for the transition period when the transistors M3, M4, M5 and M6 are switching. FIG. 3 illustrates the timing of one set of clock signals (LOI+, LOI−) relative to the shorting pulses provided by control and clock generation circuit 9, as well as an example of their combined effect on the differential output current $i_{out}$ of the double balanced mixer. In many applications an additional set of clock signals and shorting pulses are generated for a second double balanced mixer. This is optionally and preferably provided by the same control and clock generation circuit 9, as shown in dotted form in FIG. 2.

The closing of switch M7 shorts nodes 5 and 6, which are the input terminals to the mixer core. This causes the differential signals i+, i− to cancel each other out and the shorted node is then driven by the sum $(I_B)$ of the drain currents of M1 and M2, which equals their shared bias current. This combined current then passes through the mixer core, each of the two outputs receiving an equal share due to the symmetry between transistors M3 and M6 (they share the same gate and source voltages) and that between M4 and M5 (for the same reason).

These output currents being equal of course means that their difference—the differential output is zero and neither the signal nor its harmonics appear in the mixer response during these periods. The blanking of the signal during these periods means that the mixer core now effectively multiplies the signal current by an alternating sequence of 1s and −1s, separated by zeros, as illustrated also in FIG. 3. The resulting duty cycle reduction of the 1s and −1s reduces the gain of the mixer so there is a trade off between loss of gain and improved linearity.

The control and clock generation circuit needs to be fairly accurate in its timing with regard to when the shorting switch is closed relative to when the transistors of the mixer are switching but inaccuracies are tolerable. If the shorted period extends into the state when the switches have switched and are full on or off then gain is sacrificed; if the period is too short and there is no shorting during some of the period when the non-linearity is generated then the reduction of the non-linearity will be less effective.

Figure 4:
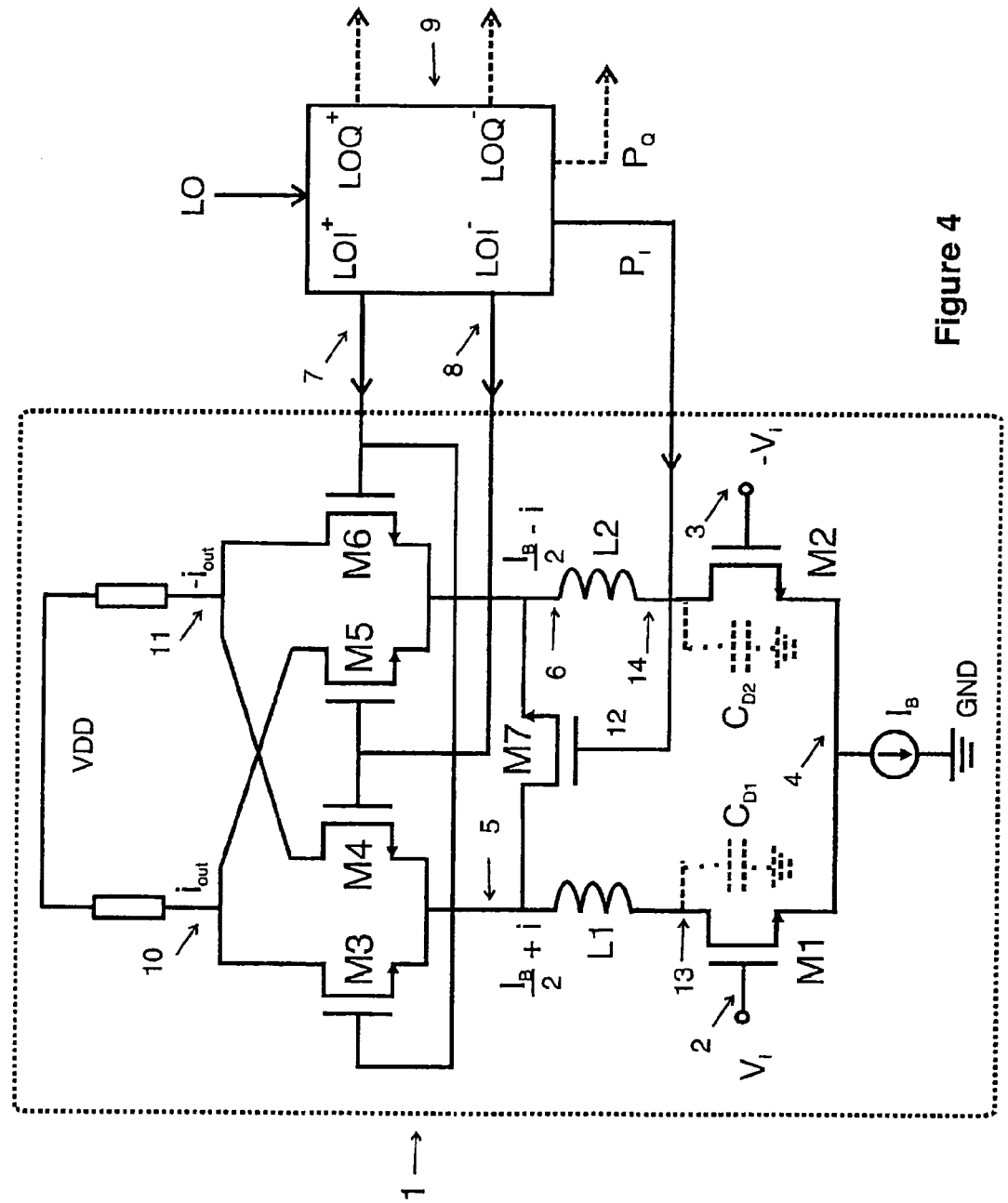
FIG. 4 is a circuit diagram of another double balanced mixer in accordance with the invention.

The control signal for switch M7 could be generated in various ways. Two suitable circuits are described later below. In these examples and as shown in FIG. 4 the control circuit 9 generates both the shorting pulses that control M7 and the clock signals that control switches of the mixer core. It would also be entirely possible for the local oscillator signals LO to be applied directly to the mixer core switches and arrange the control circuit 9 to provide the shorting pulses both in response to and aligned with the local oscillator signals LO.

FIG. 4 shows a second example of a circuit according to the invention. This is similar to the first example except that a pair of inductors L1 and L2 have been inserted between the transconductor output (drain terminals of M1 and M2, which are now marked as 13 and 14, respectively) and the input to the mixer core (marked 5 and 6 as before). This overcomes a potential limitation of the first example. The transconductor may require large transistors, for example large gate widths for M1 and M2, in order to carry substantial current without significantly compromising the output voltage range. As a consequence the parasitic capacitances associated with the output connections of the transconductor, marked as $C_{D1}$ and $C_{D2}$ in FIGS. 2 and 4 and shown as dotted to highlight their spurious nature, may also become too large for the blanking scheme outlined in the previous example to function effectively as may be desired. When the shorting switch is closing the said parasitic capacitors do not affect the shorting of the two nodes because the charges on them can redistribute quickly to allow their voltages to become equal with relatively little influence from the current sources.

After the shorting pulse transistor M7 opens and nodes 5 and 6 become separated again. Signal current needs to be established in the pair of switches that are conducting after the transition, each of which carried half the bias current immediately before the end of the shorted period. This requires node 5 and node 6 in FIG. 2 to resume the voltages appropriate for carrying the corresponding signal currents, which in turn requires $C_{D1}$ and $C_{D2}$ each to be charged by part of the corresponding transconductor output current. During such voltage resumption process that is input signal dependent, the said charging current is diverted from the corresponding conducting switch and goes missing from the desired output current. Secondary distortion may thus be introduced into the output.

The inductors introduced in the second example mitigate the voltage resumption problem by shielding $C_{D1}$ and $C_{D2}$ from the input of the mixer core that is periodically shorted. Acting as short-term current memories inductors L1 and L2 each absorbs the voltage jump at the corresponding mixer core input node 5 or 6, while keeping the voltages on $C_{D1}$ (now connected between node 13 and ground) and $C_{D2}$ (now connected between node 14 and ground) substantially unchanged during the closing of M7. While large value inductors generally perform the said current memory/voltage isolation function better, small inductors (from a few to tens of nanohenries) easily realizable as spirals in an integrated circuit can already be very effective at frequency ranges specified for popular wireless applications such as EDGE, WCDMA and wireless LAN. In integrated circuit realizations spiral inductors L1 and L2 may be constructed to maximize the mutual inductance between them (i.e. forming a mutual inductor) so as to increase the effective value of each self-inductance for differential input currents, for example by integrating them overlaid.

There are two aspects to the shorting pulses that control the closing of transistor M7. The first is the alignment of the said pulses to both the rising and the falling edges of the clock signal and the second is a brief yet controlled duration for each pulse. There are a number of ways to construct a circuit that fulfils the requirements.

Figure 5A:
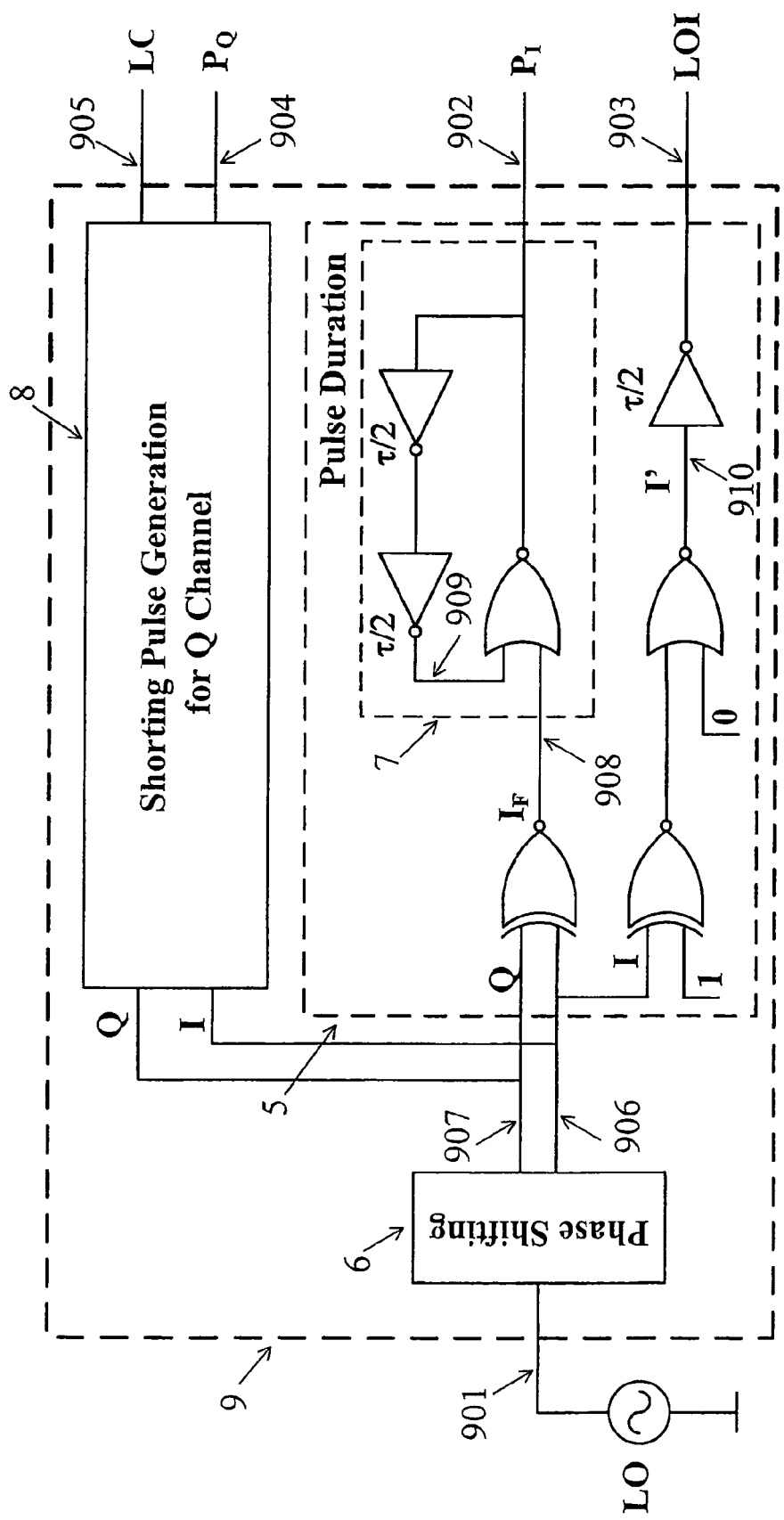
FIG. 5a is a circuit diagram of an implementation of the control and clock generation circuit of the circuits of FIGS. 2 and 4.

FIG. 5a shows a first example of the control and clock generation circuit of the circuit of FIGS. 2 and 4 that generates both the clock signals and the shorting pulses, which are correctly aligned with one another for the purpose of the present invention. In FIG. 5a, control and clock generation circuit 9 receives a local oscillator signal LO at its input (node 901) and provides a first output $P_I$ of shorting pulses at node 902, a second output LOI at node 903 for opening and closing the switches in the mixer core of the double balanced mixer 1. Optionally, a third output $P_Q$ of shorting pulses is provided at node 904 and a fourth output LOQ is provided at node 905 for opening and closing the switches in the mixer core of a second double balanced mixer as may be required in a linear quadrature modulator.

Figure 5B:
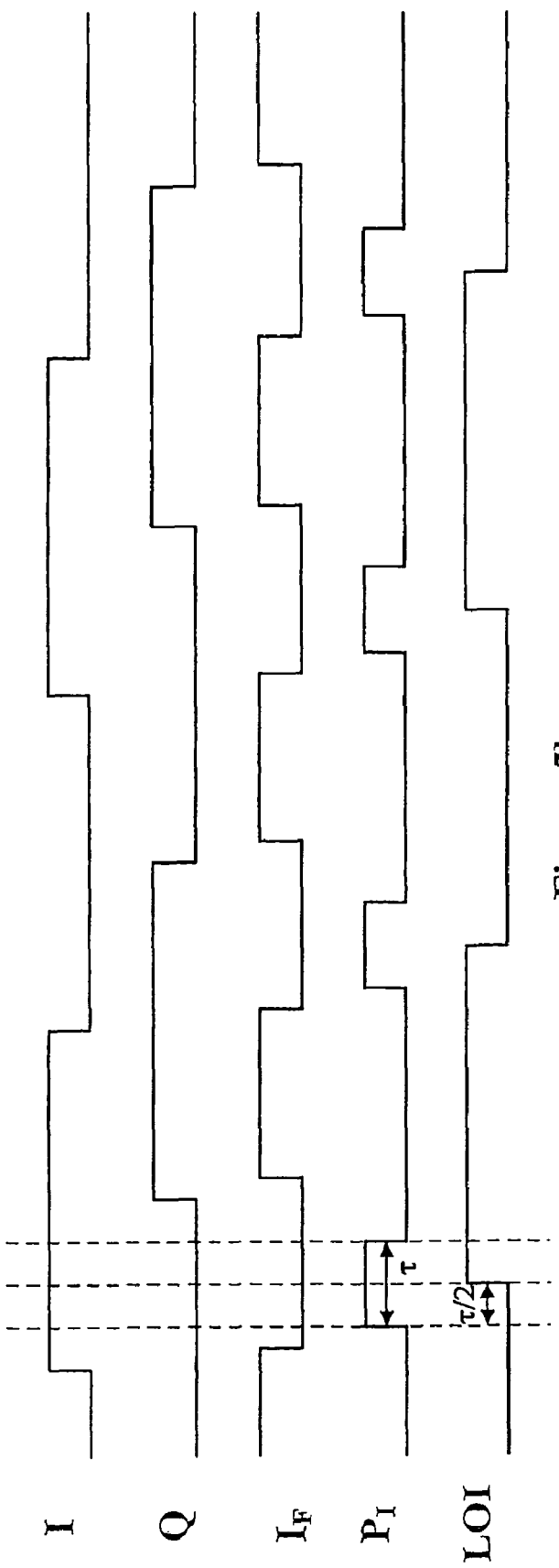

A phase shifting circuit 6 is provided that generates a first signal I at node 906 and a second signal Q at node 907 from the said LO signal. Both I and Q are at the desired carrier frequency used to switch the double-balanced mixers but are shifted from each other in phase such that both the rising and falling edges of either I or Q can be extracted using an exclusive-or logic. Known quadrature phase generators used to create clock signals in a quadrature modulator, in which the I signal is shifted nominally by 90° (quarter of the period) ahead of the Q signal, can be used for the said phase shifting circuit 16. According to one aspect of the present invention an exclusive-nor (XOR_B) logic gate, which receives signals I and Q respectively at its input nodes 906 and 907, is used to detect both the rising and falling edges of I and convert them to falling edges in its output $I_F$ at node 908, as illustrated in FIG. 5b. A pulse duration circuit 17 receives the XOR_B output $I_F$, detects its falling edges and provides an output of pulses of desired duration that are synchronized to the said falling edges. In the example shown in FIG. 5a the pulse duration circuit 17 consists of a NOR gate receiving $I_F$ on a first input at node 908 while its output $P_I$ at node 902 is delayed by two delay elements (shown in FIG. 5a as a cascade of two inverters), then fed back to the second input of the NOR gate (node 909), whose delay is preferably substantially smaller than those of the delay elements. The delay of each inverter is preferably set to $\tau/2$, so that the resulting pulse duration $\tau$ is the expected transition time between the +1 state and −1 state of a double balanced mixer. To match the centre of $P_I$ to the switching transition of the clock signal LOI at node 903, the I output of the phase shifting circuit 6 is preferably delayed by an exclusive-nor gate (receiving I on its first input at node 906 and a logic one on the other) matching that used for edge detection, followed by a NOR gate (receiving the output of the exclusive_nor gate on its first input and a logic zero on the other) matching that in the pulse duration circuit 17, and finally by the delay element between node 910 (input of the delay element and output of the NOR gate) and node 903 (output of the delay element) that is nominally identical to either of the two delay elements in the pulse duration circuit 17. Both $P_I$ and the clock signal LOI at node 903 are illustrated in FIG. 5b, where the rising edge of LOI is centred between the rising and falling edges of $P_I$. The optional circuit 8 for generating the quadrature clock signal LOQ at node 905 and the corresponding shorting pulses $P_Q$ at node 904 is similar to those boxed within 5, except the roles of I and Q inputs are exchanged and that the exclusive-nor gates are replaced by exclusive-or (XOR) gates.

Figure 6A:
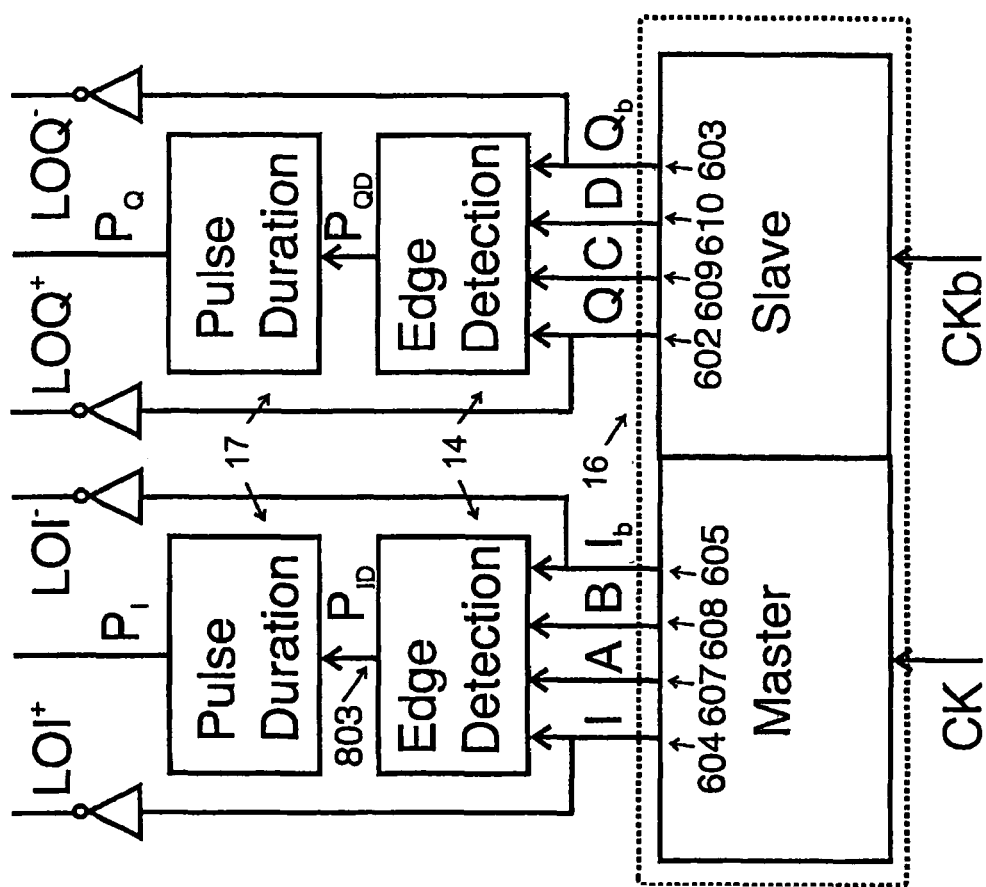
FIG. 6a is a block diagram of another implementation of the control and clock generation circuit of FIGS. 2 and 4.
Figure 6B:
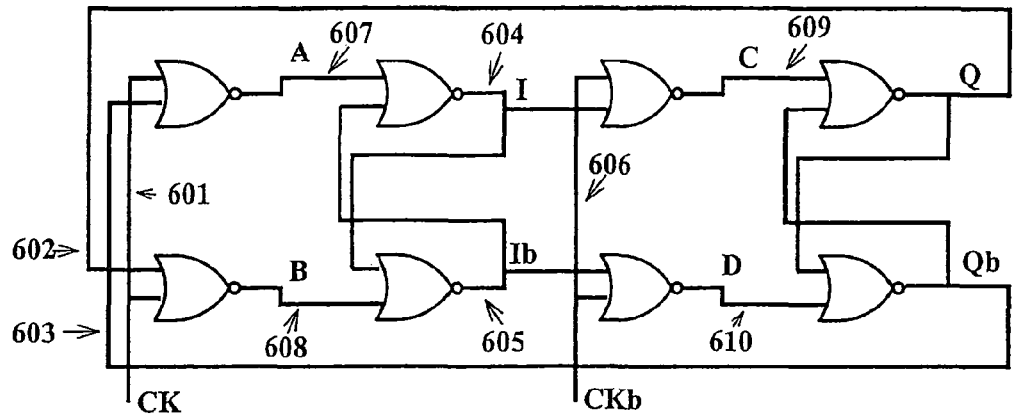
Figure 6C:
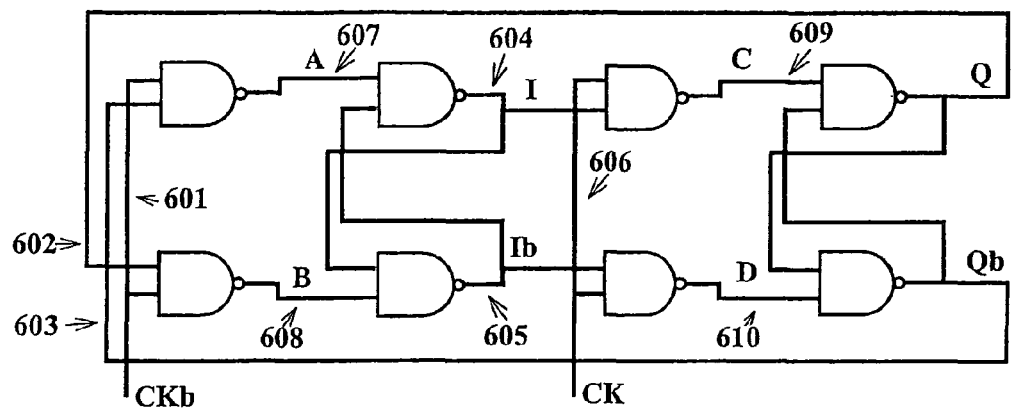
Figure 6D:
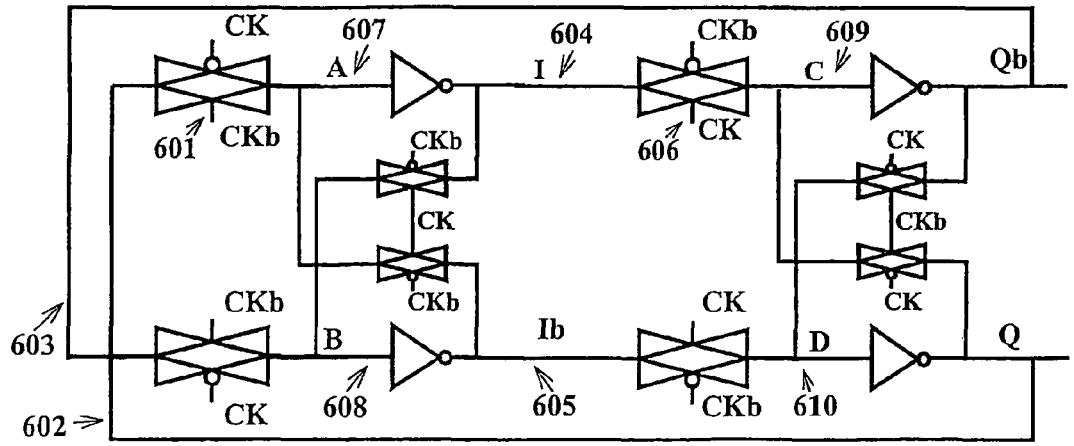

FIG. 6a shows a second example of the control and clock generation circuit. Generally it again consists of a phase shifting circuit 16, an edge detection circuit 14 and a pulse duration circuit 17. It enables full advantage to be taken of quadrature clock generator circuits typically already in place in quadrature modulators so that the additional hardware and power consumption for generating shorting pulses, which can be significant at radio frequencies, are kept low. The phase-shifting circuit 16 in FIG. 6a is based on a well-known master-slave flip-flop, three examples of which are shown in FIG. 6b with NOR gates, FIG. 6c with NAND gates and FIG. 6d employing inverters and transmission gates, respectively. Mater slave latches per se are, of course, well known to the skilled person and as can be seen each of the master and slave latches comprise a gating portion controlled by the clock signal and a latching portion comprising cross coupled gates.

Figure 7:
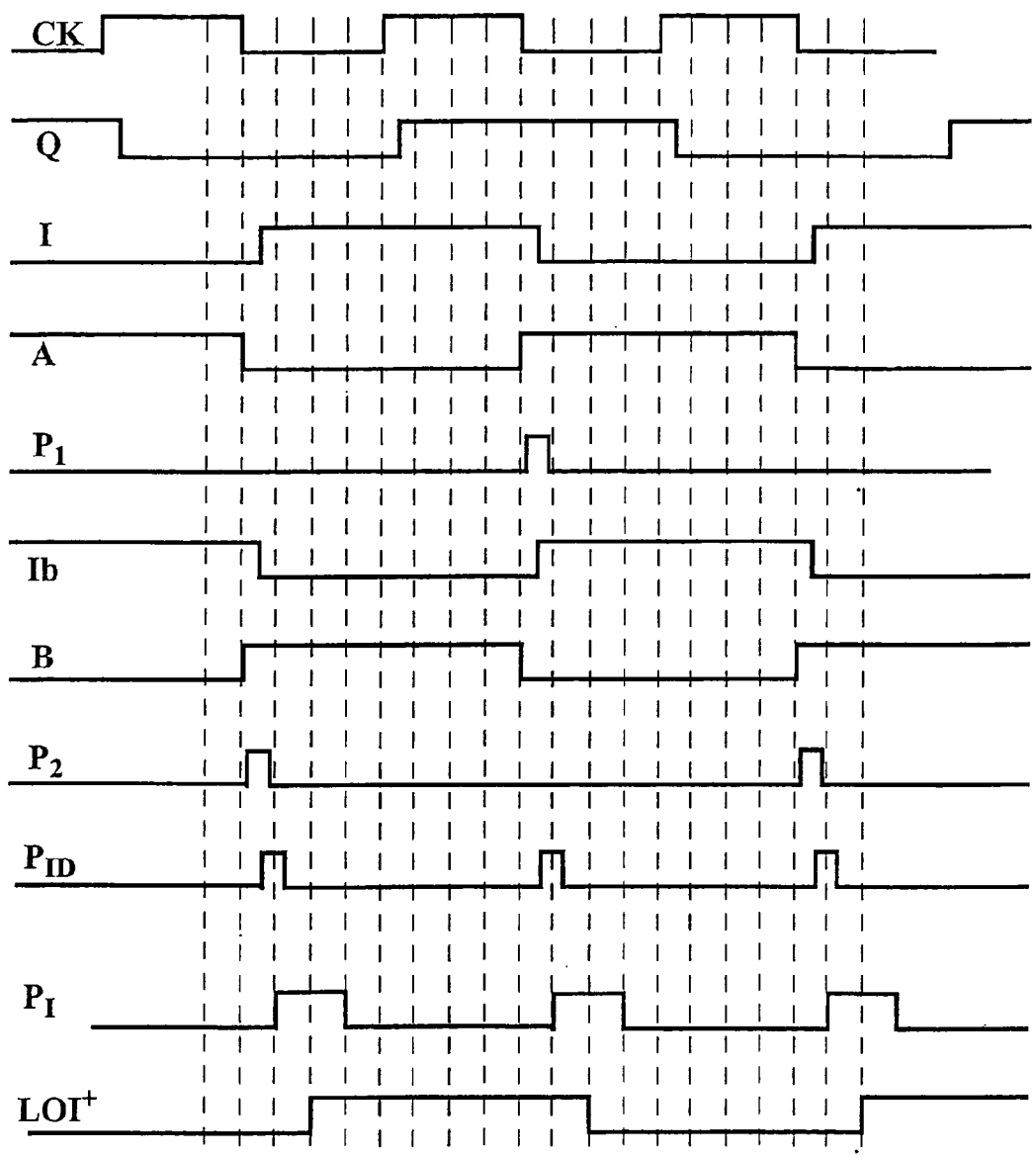
FIG. 7 shows signal waveforms illustrating the generation of shorting pulses by the circuit of FIG. 6a, FIG. 8 and FIG. 9.

Returning to their use in the invention, in FIG. 6b, for example, four NOR gates on the left half of the circuit form the master latch receiving the clock input CK on node 601 and the differential output of the slave latch (formed by the four NOR gates on the right hand half of the circuit) Q and Qb (which is also the output of the overall flip-flop) on its differential input nodes 602 and 603, respectively, and provides a differential output I and Ib, on nodes 604 and 605, respectively. The slave latch receives I and Ib, on its input nodes 604 and 605 as well as the inverse of CK, CKb, on its clock input node 606. The feedback of the flip-flop output to its (inverted) input makes it toggle upon the rising edges of the clock so that the output Q of the flip-flop is a square wave at double the period, or half the frequency, of the clock. Symmetry dictates that the master latch output I is of the same waveform as Q except that the toggling is triggered at falling clock edges, half a clock period before Q, or a quarter of the toggling period. FIG. 7 illustrates the timing relationship between the clock signal CK, the quadrature output Q and the in-phase output I. In standard quadrature modulators the local oscillator signal is often generated at twice the carrier frequency and applied to the CK input of the toggle flip-flop, and the differential outputs of the master stage, I, Ib, and those of the slave stage, Q, Qb, both at the carrier frequency, are the only signals of interest. In these examples signals at the internal nodes of the master latch, A at 607 and B at 608, and those of the slave latch, C at 609 and D at 610, are also provided as the outputs of the phase shifting circuit to simplify the realization of the edge detection and pulse duration circuits.

Figure 8A:
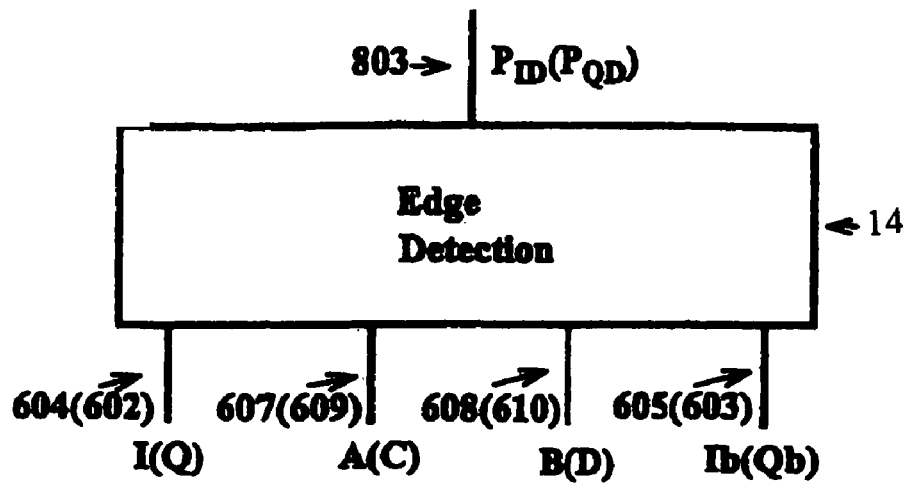
FIG. 8a is the block diagram of the edge detection circuit in FIG. 6a, defining its inputs and output.

The edge detection circuit 14 receives I, Ib, A and B respectively at its four inputs 604, 605, 607 and 608 and provides an output $P_{ID}$ at node 803, as shown in FIG. 8a. Similarly a second copy of the edge detection circuit (see FIG. 6a), when needed, receives Q, Qb, C and D at its inputs (signal names and corresponding connections to those in FIG. 6a are marked in brackets in FIG. 8a) and provides an output $P_{QD}$. Two examples of the realization of the edge detection circuit 14 are given in FIGS. 8b and 8c, respectively.

Figure 8B:
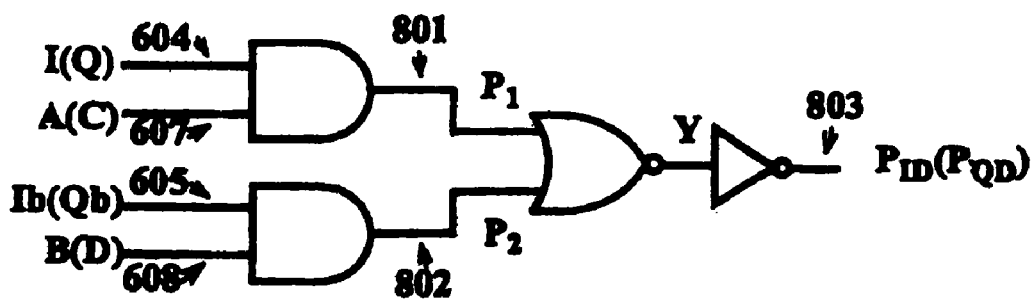

The edge detection example in FIG. 8b comprises a first AND logic gate, connected to receive I on its first input on node 604 and A on its second input on node 607, and to provide an output $P_1$ on node 801; a second AND gate, connected to receive Ib on its first input on node 605 and B on its second input on node 608, and to provide an output $P_2$ on node 802; an OR logic gate (shown in FIG. 8b as a NOR gate followed by an inverter buffer) is connected to receive $P_1$ and $P_2$ respectively on its inputs at 801 and 802 and to provide an output $P_{ID}$ at node 803. Because the phase-shifting circuit output I is only a slightly delayed inversion (in FIG. 6b by a NOR gate, for example) of A, the said output $P_1$ rises on the rising edge of A and falls on the corresponding falling edge of I, and remains zero otherwise. Similarly $P_2$ rises on the rising edge of B (occurring at about the same time as the falling edge of A) and falls on the corresponding falling edge of Ib (occurring at about the same time as the rising edge of I), and remains zero otherwise. The edge detector output $P_{ID}$, being the sum (logic OR) of $P_1$ and $P_2$, therefore contains narrow impulses aligned with both the rising and the falling edges of I, as illustrated also in FIG. 7.

Figure 8C:
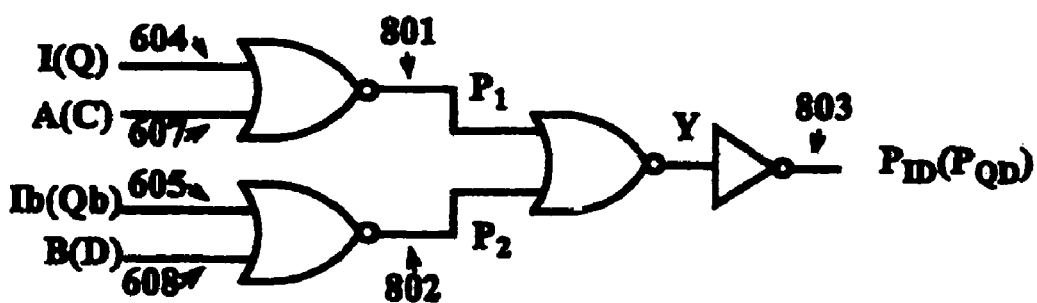

The circuit of FIG. 8c is an alternative to that of FIG. 8b and provides the same function but uses NOR gates instead of AND gates.

To convert such impulses into pulses of defined duration an edge triggered delay (ETD) element is required for the pulse duration circuit 17, as shown in FIG. 9a. The said pulse duration circuit comprises an ETD circuit connected to receive the edge detection circuit output $P_{ID}$ on'its first input at node 803, the reset signal on its second (reset) input at node 901 and to provide a logic 1 in its output $P_I$ at node 902 in response to each rising (or each falling) edge in $P_{ID}$ and a logic zero in $P_I$ in response to each reset signal on the second input; a delay circuit connected to receive $P_I$ on its input at node 902 and in response to provide a delayed replica of $P_I$ at its output on node 901. FIG. 9b shows an example of the realization of the said ETD circuit, which comprises a D-flip-flop receiving a logic 1 at its D input, its clock input providing a first input node 803, its reset input providing a second input node 901 and its output providing the ETD output $P_I$ at node 902.

Although the diagrams in FIGS. 9a and 9b give a working example and clearly illustrate the concepts of the second example of the pulse duration generation, in practical realizations many simplifications are possible to merge the edge detection circuit 14 and pulse duration circuit 17 into a single schematic with fewer transistors. FIG. 9c illustrates an example of such simplification. There is provided a first NMOS transistor MN1 with its source terminal connected to ground, its gate terminal providing a first input for the edge detection circuit 14 in FIG. 6a, its drain terminal connected to node 911; a second NMOS transistor MN2 with its source terminal connected to node 911, its gate terminal providing a second input for 14, its drain terminal connected to node 912; a third transistor MN3 with its source terminal connected to ground, its gate terminal providing a third input for 14 and its drain terminal connected to node 913, a fourth transistor MN4 with its source terminal connected to node 913, gate terminal providing a fourth input for 14 and its drain terminal connected to node 912. The said first and second inputs are used to receive A and I outputs of the phase shifting circuit 16 in FIG. 6a. Both pairing A to first input, I to second input or vice versa achieve the same objective. Similarly the third and fourth inputs are used to receive B and Ib. There is also provided a first PMOS transistor MP1 with its source terminal connected to the voltage supply $V_{DD}$, its gate terminal connected to node 914 and its drain terminal connected to node 912; a second PMOS transistor MP2 with its source terminal connected to $V_{DD}$, its gate terminal connected to node 912 and its drain terminal connected to node 915 that provides the output $P_I$ of the pulse duration circuit 17 of FIGS. 6a and 9a; a fifth NMOS transistor MN5 with its source terminal connected to ground, its gate terminal connected to node 912 and its drain terminal connected to node 915; and a sixth NMOS transistor MN6 with its source terminal connected to ground, its gate terminal connected to node 916 that provides the reset input of FIGS. 9a and 9b and its drain terminal connected to node 915; a first logic inverter INV1 having its input connected to node 915 and its output connected to node 917; a second logic inverter INV2 having its input connected to node 917 and its output connected to node 916; and a third logic inverter INV3 having its input connected to node 916 and it output connected to node 914.

Each time the output $P_I$ on node 915 rises from logic zero to logic one, it is followed by node 916 rising to logic one after a delay of τ (twice τ/2), causing transistor MN6 to conduct and resetting $P_I$ to logic zero. Node 916 continues to be high for a period of τ until the logic zero of $P_I$ propagates through delaying inverters INV1 and INV2, during which period transistor MP1 is on, charging node 912 and setting its voltage Y to logic one, turning on MN5 and turning off MP2 at the same time. Once node 916 follows $P_I$ to logic zero MN6 is turned off and the output of INV3 rises to logic one, turning off MP1. As long as inputs I, A, Ib, and B are not in transition, paths through MN1 and MN2, MN3 and MN4, as well as MP1 are in high impedance state and the charge stored on the Parasitic capacitance (marked in dotted form as $C_Y$) at node 912 will keep Y at logic one, which keeps $P_I$ latched to logic zero through the inverter formed by MN5 and MP2. Either the rising transition of A followed by the falling transition of I or the rising transition of B followed by the falling transition of Ib (hence the rising transition of I) will short node 912 to ground through either MN1 and MN2 because of the brief moment during which both A and I are high or MN3 and MN4 because of the brief moment during which both B and Ib are high. The shorting of 912 to ground causes node 915 to rise through the inverter formed by MP2 and MN5, which sets $P_I$ to logic one, and the subsequent events will continue as have been described at the beginning of the present paragraph.

The delay in FIG. 6b between B rising to logic one (A falling to logic zero), followed by Ib falling to logic zero, and I subsequently rising to logic one is the sum of two inversion delays by NOR-gate. In FIG. 9c the delay between A (or B) rising to logic one, Y falling to logic zero and $P_I$ rising to logic one is also the sum of two inversion delays by NOR gate. Hence the rising (and falling) edges of I are aligned with those of $P_I$. Delaying I by one inverter matched to INV1 (or INV2) to generate LOI therefore will centre each of the latter's rising edges in the middle of the corresponding pulse in $P_I$.

In the above examples the edge detector has used I and Q versions of the oscillator signals. If they are not being used (and it is not desired to add a phase shifting network to generate them) the control circuit can comprise an edge detector that is responsive to just a single phase of the local oscillator signals; this would comprise, for example, two edge detectors respectively for detecting the positive and negative going edges of the local oscillator signal and ORing together their outputs.

In FIGS. 5 through 9 standard logic and circuit symbols in single ended notation have been used to illustrate the underlying ideas of the present invention. It will be clear to those skilled in the art, however, that the same ideas can be easily realized using differential or pseudo-differential logic, which is especially preferable in radio frequency applications.

The invention claimed is:

1. A mixer circuit comprising:
a source of local oscillator signals connected to provide first local oscillator signals or second local oscillator signals derived from the first local oscillator signals,
a first signal input port having first and second nodes,
an output port having first and second nodes, switches responsive to the first local oscillator signals or the second local oscillator signals to switch between (1) connecting the first and second nodes of the first input port respectively to the first and second nodes of the output port, and (2) connecting the first and second nodes of the first input port respectively to the second and first nodes of the output port,
wherein the mixer circuit further comprises a switch connected to short the first and second nodes of the first signal input port in response to a shorting signal, and a control circuit responsive to the first local oscillator signals to provide the shorting signal to short the first and second nodes of the first signal input port for periods when the switches that connect the first input port to the output port are switching.

2. A mixer circuit as claimed in claim 1 further comprising
a second signal input port comprising first and second nodes,
a first inductor connected between the first node of the second signal input port and the first node of the first signal input port, and a second inductor connected between the second node of the second signal input port and the second node of the first signal input port.

3. A mixer circuit as claimed in claim 2 wherein the first and second inductors have a mutual inductance between the first and second inductors.

4. A mixer circuit as claimed in claim 2 further comprising a third signal input port having first and second nodes and a transconductor connected to convey the signal at those nodes to respective nodes of the second signal input port.

5. A mixer circuit as claimed in claim 1 further comprising a third signal input port having first and second nodes and a transconductor connected to convey the signal at those nodes to respective nodes of the first signal input port.

6. A mixer circuit as claimed in claim 1 wherein the control circuit comprises an edge detector circuit responsive to the local oscillator signals and having an output indicative of the edges therein, and a pulse generating circuit responsive to that output to provide a pulse in the shorting signal timed relative to each edge.

7. A mixer circuit as claimed in claim 6 further comprising a delay circuit connected to receive the local oscillator signals and to delay the first local oscillator signals so their edges coincide with the pulses output by the control circuit, the local oscillator signals from the delay circuit being connected so as to control the switches that connect the first input port to the output port.

8. A mixer circuit as claimed in claim 7 wherein the pulse generating circuit comprises first and second delay elements connected in series and the delay circuit comprises a third delay element, the first, second and third delay elements each providing the same delay.

9. A mixer circuit as claimed claim 6 further comprising a phase shift circuit connected to receive the first local oscillator signals and provide them in quadrature form to the edge detector circuit.

10. A mixer circuit as claimed in claim 9 further comprising a master slave latch device comprising a master latch comprising a gating portion and a latching portion, and a slave latch comprising a gating portion and a latching portion, and the edge detector circuit is responsive to both an output of the latching portion of and to an output of the gating portion of one of the master latch and the slave latch.

11. A mixer circuit as claimed in claim 1 wherein the switches that connect the first input port and the output port comprise:
a first pair of switches connected to switch the signals at the first node of the first signal input port alternately and respectively to the first and second nodes of the output port, and
a second pair of switches connected to switch the signals at the second node of the first signal input port alternately and respectively to the second and first nodes of the output port.

12. An apparatus comprising a modulator comprising a mixer circuit, the mixer circuit comprising:
a source of local oscillator signals connected to provide first local oscillator signals or second local oscillator signals derived from the first local oscillator signals,
a first signal input port having first and second nodes,
an output port having first and second nodes, switches responsive to the first local oscillator signals or the second local oscillator signals to switch between (1) connecting the first and second nodes of the first input port respectively to the first and second nodes of the output port, and (2) connecting the first and second nodes of the first input port respectively to the second and first nodes of the output port,
wherein the mixer circuit further comprises a switch connected to short the first and second nodes of the first signal input port in response to a shorting signal, and a control circuit responsive to the first local oscillator signals to provide the shorting signal to short the first and second nodes of the first signal input port for periods when the switches that connect the first input port to the output port are switching.

13. An apparatus comprising a demodulator comprising a mixer circuit, the mixer circuit comprising:
a source of local oscillator signals connected to provide first local oscillator signals or second local oscillator signals derived from the first local oscillator signals,
a first signal input port having first and second nodes,
an output port having first and second nodes, switches responsive to the first local oscillator signals or the second local oscillator signals to switch between (1) connecting the first and second nodes of the first input port respectively to the first and second nodes of the output port, and (2) connecting the first and second nodes of the first input port respectively to the second and first nodes of the output port,
wherein the mixer circuit further comprises a switch connected to short the first and second nodes of the first signal input port in response to a shorting signal, and a control circuit responsive to the first local oscillator signals to provide the shorting signal to short the first and second nodes of the first signal input port for periods when the switches that connect the first input port to the output port are switching.

14. A method of mixing signals comprising
providing local oscillator signals;
switching signals at a first node of an input port alternately to a first node and a second node of an output port in response to the local oscillator signals, and switching signals at a second node of the input port alternately to the first node and the second node of the output port in response to the local oscillator signals, the first node of the output port receiving signals alternately from the first and second nodes of the input port and the second node of the output port receiving signals alternately from the second and first nodes of the input port, and
shorting the first and second nodes of the input port for periods during which the signals at the input port are being switched between the first and second nodes of the output port.

15. A mixer circuit comprising a source of local oscillator signals connected to provide first local oscillator signals or second local oscillator signals derived from the first local oscillator signals,
a first signal input port having first and second nodes,
an output port having first and second nodes,
a first pair of switches connected to switch, in response to the first local oscillator signals or the second local oscillator signals, the signals at the first node of the first signal input port alternately and respectively to the first and second nodes of the output port,
a second pair of switches connected to switch, in response to the first local oscillator signals or the second local oscillator signals, the signals at the second node of the first signal input port alternately and respectively to the second and first nodes of the output port, wherein the mixer circuit further comprises a switch connected to short the first and second nodes of the first signal input port in response to a shorting signal, and a control circuit responsive to the first local oscillator signals to provide the shorting signal to short the first and second nodes of the first signal input port for periods when the switches that connect the first input port to the output port are switching, the control circuit comprising an edge detector circuit responsive to the first local oscillator signals and having an edge output indicative of the edges in the first local oscillator signals, and a pulse generating circuit responsive to the edge output to provide a pulse in the shorting signal timed relative to each edge, wherein the mixer circuit further comprises a second signal input port comprising first and second nodes, a first inductor connected between the first node of the second signal input port and the first node of the first signal input port, and a second inductor connected between the second node of the second signal input port and the second node of the first signal input port, wherein the mixer circuit further comprises a third signal input port having first and second nodes and a transconductor connected to convey the signal at those nodes to respective nodes of the second signal input port.

* * * * *